United States Patent [19]
Leung

[11] Patent Number: 5,558,718
[45] Date of Patent: Sep. 24, 1996

[54] PULSED SOURCE ION IMPLANTATION APPARATUS AND METHOD

[75] Inventor: Ka-Ngo Leung, Hercules, Calif.

[73] Assignee: The Regents, University of California, Oakland, Calif.

[21] Appl. No.: 225,043

[22] Filed: Apr. 8, 1994

[51] Int. Cl.⁶ .................................................. C23C 16/00
[52] U.S. Cl. ..................... 118/723 E; 156/345; 250/251; 250/492.2
[58] Field of Search ............. 118/723 E, 723 ER, 118/728; 156/345; 250/251, 492.2

[56] References Cited

U.S. PATENT DOCUMENTS

| | | | |
|---|---|---|---|
| 4,725,449 | 2/1988 | Ehlers et al. | 118/723 AN X |
| 4,764,394 | 8/1988 | Conrad. | |
| 5,019,752 | 5/1991 | Schumacher | 315/344 |
| 5,212,425 | 5/1993 | Goebel et al. | 315/111.21 |
| 5,218,179 | 6/1993 | Matossian et al. | 219/121.430 |
| 5,329,205 | 7/1994 | Goebel et al. | 315/111.21 |
| 5,330,800 | 7/1994 | Schumacher et al. | 427/523 |
| 5,354,381 | 10/1994 | Sheng | 118/723 E |

Primary Examiner—R. Bruce Breneman
Assistant Examiner—Joni Y. Chang
Attorney, Agent, or Firm—Pepi Ross; Paul R. Martin

[57] ABSTRACT

A new pulsed plasma-immersion ion-implantation apparatus that implants ions in large irregularly shaped objects to controllable depth without overheating the target, minimizing voltage breakdown, and using a constant electrical bias applied to the target. Instead of pulsing the voltage applied to the target, the plasma source, for example a tungsten filament or a RF antenna, is pulsed. Both electrically conducting and insulating targets can be implanted.

25 Claims, 7 Drawing Sheets

PULSED SOURCE ION IMPLANTATION APPARATUS AND METHOD

This invention was made with U.S. Government support under Contract No. DE-AC03-76SF00098 between the U.S. Department of Energy and the University of California for the operation of Lawrence Berkeley Laboratory. The U.S. Government may have certain rights in this invention.

BACKGROUND OF THE INVENTION

1. Field of the Invention

This invention relates generally to the field of surface modification by ion implantation and particularly to ion implantation in irregularly shaped objects.

2. Description of Related Art

Ion implantation has been used to change the surface properties of a variety of materials for many purposes. Ion implantation hardens many materials and can increase the lifetime of friction-bearing parts. Ion implantation can improve corrosion resistance. Ion implantation can improve the lifetime of cutting tools, metal parts that operate in salt water or other corrosive environments, biological implants, and machine parts. Metals, ceramics, and plastics are among the types of materials it is desirable to implant. A general discussion of the benefits and techniques of ion implantation can be found in an article by S. Picraux, et. al., "Ion Implantation of Surfaces", *Scientific American*, 252 (3): 102–113, 1985. More technical discussion can be found in *Handbook of Ion Implantation Technology*, J. C. Ziegler, ed.; Elsevier Science Publishers B. V. (Amsterdam: 1992).

Ion implantation has typically been achieved by generating ions in a confined volume, either from a gas, by sputtering, or by vaporization of a solid, and then extracting them in a beam by applying an electrical potential gradient. A major part of the cost of building conventional ion implantation equipment is associated with extracting and focusing the ion beam on the target to be implanted. At the point the beam hits the target, the ions must match an energy and density specification that results in the desired implantation characteristics. Typically, in an attempt to uniformly implant a target surface, the beam is rastered back and forth across the surface which faces the beam. If many sides of the target are to be implanted, it is typically attached to a mobile stage that supports rotation of the target in the ion beam allowing all desired surfaces to be implanted. This process is slow. It is also difficult to prevent shadowing of the beam if the target contains uneven surfaces, as for example, in a screw or a nut. Thus efficient use of ion beams to implant targets is limited to simple shapes. An additional problem in use of ion beams for implantation is the complex stage that is necessary to rotate the target in the beam.

Recently John R. Conrad obtained patent U.S. Pat. No. 4,764,394 (University of Wisconsin Alumni Association) for a method and apparatus for implanting three-dimensional materials by achieving implantation from all sides of the target simultaneously. Conrad places the target in a plasma chamber, then applies a high negative potential pulse to the target relative to the walls of the chamber (pulsed target system). The high voltage pulse causes the ions to accelerate into the target over all exposed surfaces. The target may have any of a variety of shapes (FIG. 1).

There are however several difficulties encountered when applying a large, pulsed, negative potential to the target. Because, during the rise time of a pulse, the voltage varies between zero and the maximum potential applied, the energy of individual ions approaching the target varies as a function of time. As a result, the penetration of the ions into the target is spread as a function of time (see FIG. 1B, rise time of pulse). That is, the ions have a broad implant profile. This is undesirable for applications in which a uniform or controlled deposition layer is needed, such as in several oxygen implantation applications.

A second problem with the pulsed target system is that because the plasma source is always on, considerable secondary emission electrons, created when the ions interact with the chamber walls, are introduced into the chamber. This affects the plasma and the total current in the circuit used to apply voltage to the target. (see FIG. 1A) The total current ($I_T$) in that circuit is the sum of the current resulting from the current drawn by the object ($I_{impact}$) and the secondary emission electrons leaving the target ($I_e$). That is, $I_T = I_{impact} + I_e$. As $I_{impact}$ increases, the switch needed to control the applied high potential becomes more difficult to design. For a large target, $I_e$ by itself can be large enough to require a specially-designed, expensive electronic switch. A complex circuit is then required, capable of switching a high-current high-voltage power source (FIG. 1C). An improved pulse modulator switch, invented specifically for this application, is disclosed in U.S. Pat. No. 5,212,425, issued May 18, 1993 to D. M. Goebel and J. N. Matossian and assigned to Hughes Aircraft Company. This modulator switch has increased duty factor and power handling capabilities over that used by Conrad. However it would be preferable to eliminate the need for such a complex switch.

Another problem associated with a plasma source that is always on is that heat loading on the target due to plasma bombardment and radiation heating can be high. In U.S. Pat. No. 5,218,179 issued to J. N. Matossian and D. M. Goebel on Jun. 8, 1993 and assigned to Hughes Aircraft Company, it is calculated that using the plasma-production process disclosed in Conrad's patent, as much as 1 W/cm$^2$ of target heating is produced for large-scale targets such as dies and tools used in manufacturing automobiles. In their patent, Matossian and Goebel disclose a novel arrangement for ion source implantation wherein the plasma is generated in a chamber which is separate from, and opens into, an implantation chamber. However, it would be preferable to avoid the need for complex geometries that separate the plasma generation volume from the implantation volume.

Matossian and Goebel, in their patent '179 address yet another difficulty with Conrad's basic plasma-source-ion-implantation technique. In order to obtain high plasma densities, many filaments must be used and heated to temperatures on the order of 2000° C. At this temperature, so much evaporation of the filament material occurs that the target would be coated unless a complicated baffling was constructed. Matossian and Goebel disclose use of a separate plasma generating chamber in which line-of-sight communication between the plasma generating source and the target is minimized, thereby minimizing the transfer of filament material to the target. A clean plasma source would provide a better solution to the problem of filament contamination by evaporation or sputtering.

Where more than one ion species is desired for implantation, as in the case of multi-ion implantation, the ion production of each ion specie cannot be selectively controlled using the plasma ion implantation system of Conrad. Matossian and Goebel disclose in their patent '179, that use of two or more separate plasma chambers enables them to generate plasmas of different ion species which diffuse into, and mix in, the implantation chamber. More desirable would be the capability of producing mixed ion species without use of specially designed, geometrically-complex, separated chambers to generate the plasma for each ion desired.

A further problem associated with maintaining the plasma on constantly during implantation is the introduction of ionizing x-rays into the plasma. Ionizing x-rays give rise to yet more secondary electrons. The plasma density varies with the presence of secondary electrons and becomes difficult to control resulting in irregular depth of ion implantation.

A sixth difficulty with the pulsed target system is that electrical breakdown between the plasma and the target occurs at corners on the target. When no plasma is present, the voltage applied to the target is between the target and the walls of the plasma chamber. However when the plasma is on, the entire voltage drops across the small distance between the plasma boundary and the surface of the target. Thus the useful applied voltage is limited to the breakdown voltage ($V_{BD}$) across the small gap that separates the plasma boundary and the target. The problem is worst near portions of the target with small radius of curvature yielding the problematic result of degrading sharp corners and morphological detail on the target.

These problems with the current methods of ion implantation limit the usefulness of the technique to small objects without a high level of morphological detail.

A device in which large targets of varying shapes could be implanted with ions, of one or more species, to uniform depth, without overheating, would be extremely desirable. It would be additionally beneficial to be able to pulse the implantation voltage with a simple switch rather than a high power switch. A further advantage would be the ability to control or minimize the effect of secondary electrons on the plasma density so that low density plasmas could be used. It would be even more advantageous to minimize voltage breakdown thus preserving the morphological detail on the target.

DESCRIPTION OF THE INVENTION

Summary of the Invention

The inventive plasma immersion ion implantation apparatus is comprised of a vacuum chamber, a plasma source located inside the vacuum chamber, a means of pulsing the plasma source on and off, and a voltage source or power supply used to apply a voltage to the target or object to be implanted.

An important feature of the inventive apparatus is that the plasma source is switched on and off, or pulsed, during implantation of the ions into the target. The inventive ion implantation apparatus avoids overheating, implants the majority of ions to a predictable and/or desirable depth, does not require a high power switch and generates minimal secondary electrons. The target is located inside the plasma generation vacuum chamber so no ion beam need be extracted, focused and manipulated. The plasma source is operated in a pulsed mode to limit target heating and secondary electron generation.

A constant bias voltage is applied to the target so that ions implant into the target with a preferred profile; a high power electronic switch is not needed. Preferably, plasma ions are generated using a radio frequency (RF) antenna to couple power to the gas volume, although other ion generating methods may be used, for example, microwave and vacuum arc discharge ionization methods. The RF driven plasma can be easily operated in a pulsed mode.

The present invention utilizing a pulsed plasma source enables implantation of ions at energies even higher than the breakdown potential between plasma and the target. Synchronized pulsing between the plasma source and the target potential results in ion implantation voltages equal to and greater than the breakdown voltage.

BRIEF DESCRIPTION OF THE DRAWINGS

FIG. 1: illustrates several aspects of the prior art.

FIG. 4: are oscilloscope traces that show the 1.8 MHz RF pulses at the output of the RF generator for different time scales.

DESCRIPTION OF THE INVENTION

Generally a plasma source comprises a vacuum chamber into which a gas is introduced. The gas is ionized into a plasma through electron bombardment, or microwave, or RF power that is coupled to the gas volume by an antenna [Leung, K. N., et al., *Rev. Sci. Instrum.* 62(1), pp. 100–104]. Alternatively, the plasma may be formed from a metal. For example, metal ion sources include, without limitation, the metal from which the RF coil is made and vacuum arc discharge cathodic materials, sputtering and other processes.

Figure 1A:
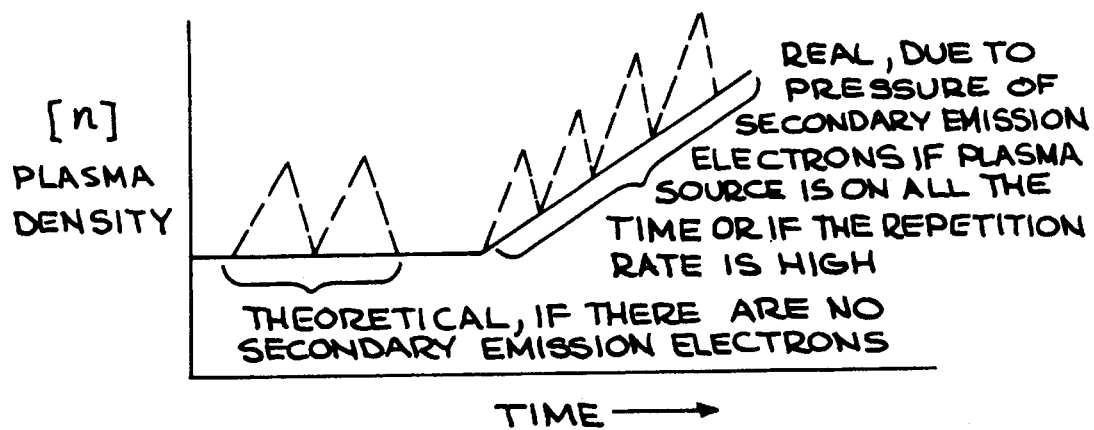
FIG. 1A: illustrates the plasma density as a function of time when the plasma source is left on continuously and secondary emission electrons from the target perturb the plasma density.
Figure 1B:
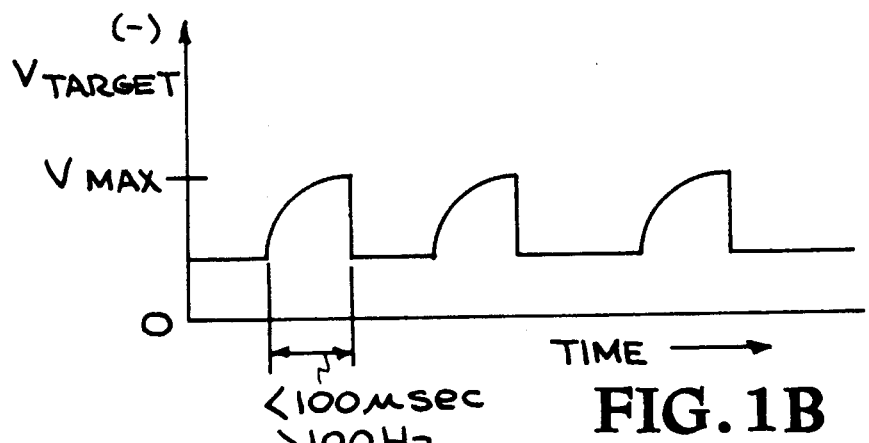
FIG. 1B: shows pulse shape and size of the bias voltage applied to the target. The real time response as each voltage pulse applied to the target ($V_{target}$) goes from zero to $V_{max}$ yields a broad ion implant profile.
Figure 1C:
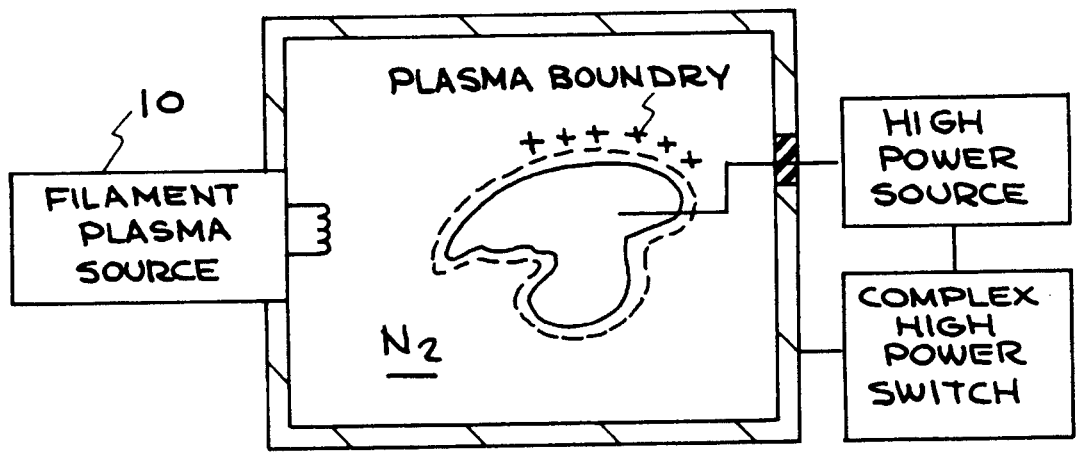
FIG. 1C: is a schematic representation of the prior art plasma ion implantation system showing the High Power switch and plasma boundary location relative to the target.
Figure 2:
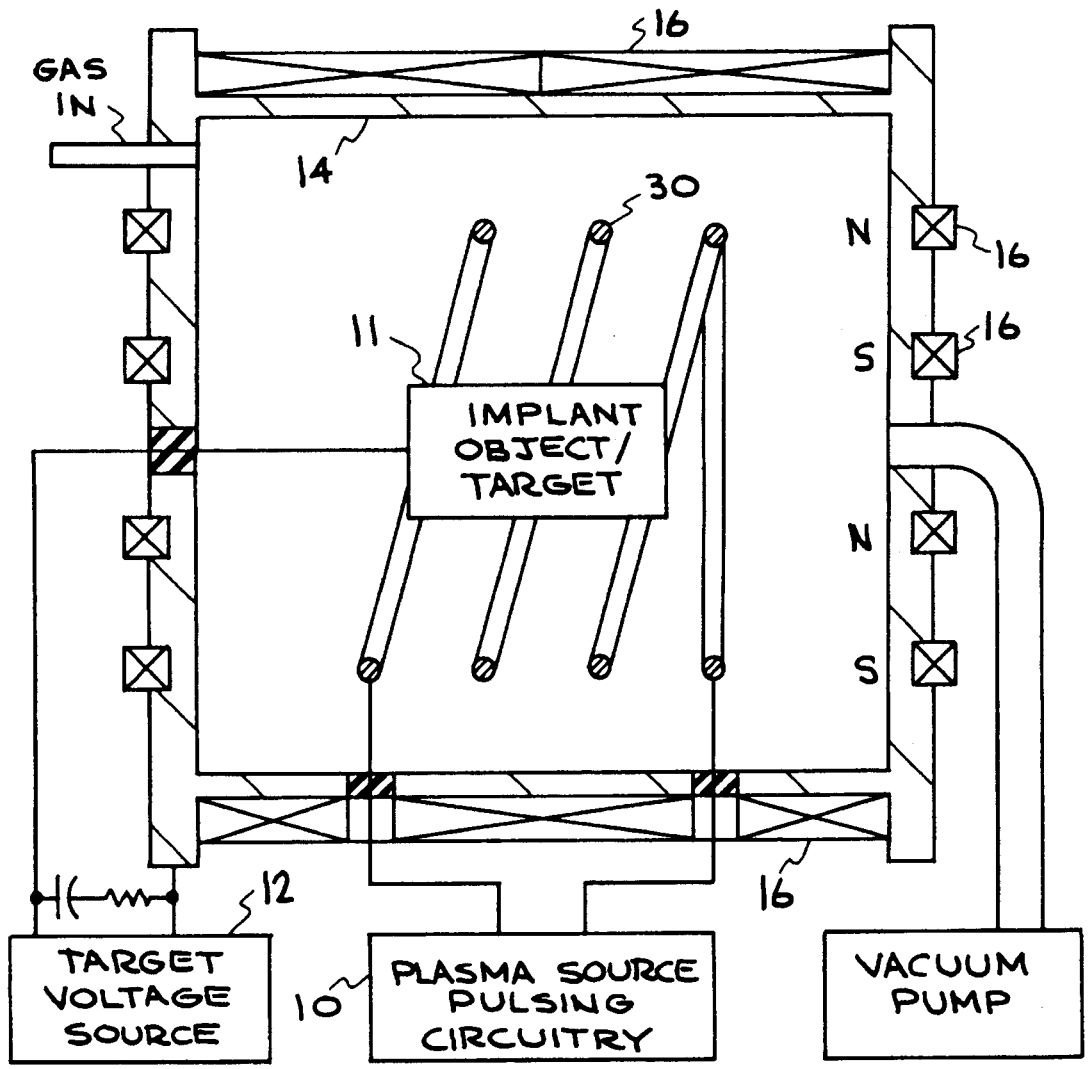
FIG. 2: illustrates several aspects of the inventive ion implantation system.
Figure 2A:
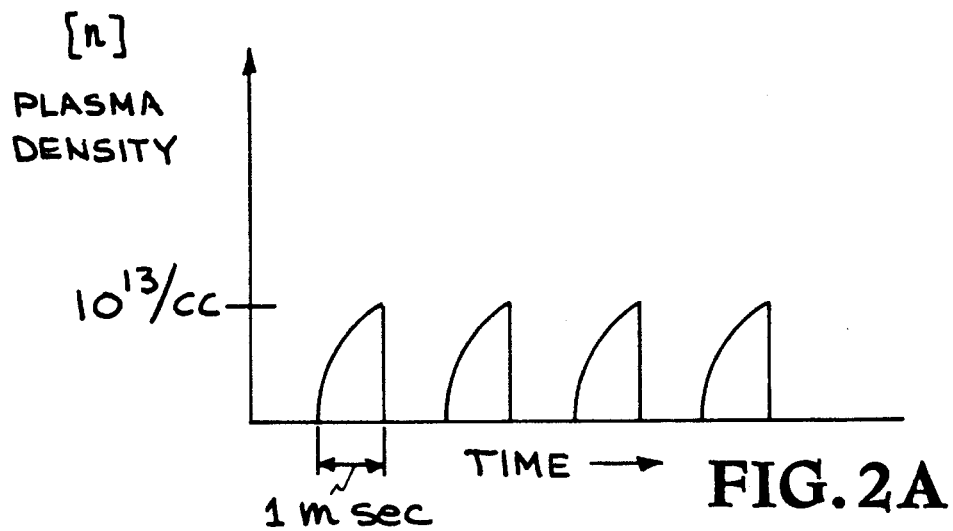
FIG. 2A: illustrates the plasma density as a function of time when the plasma source is pulsed.
Figure 2B:
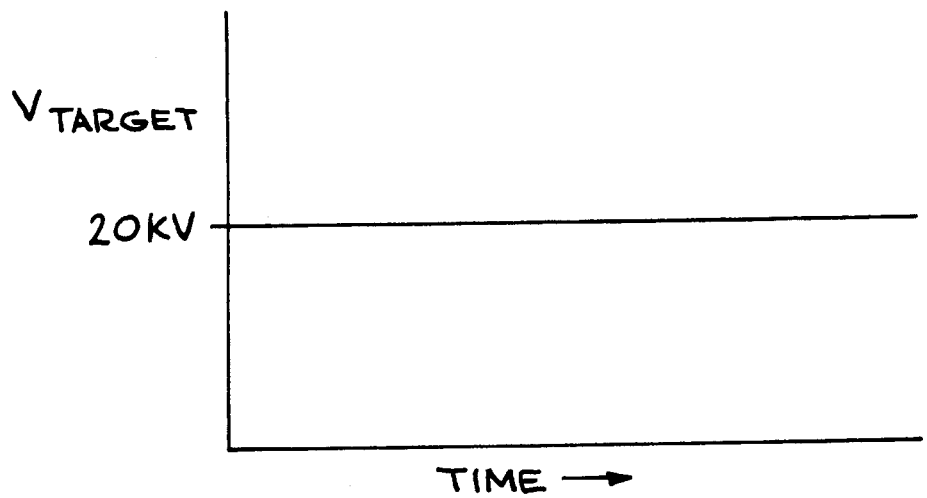
FIG. 2B: shows the constant bias voltage applied to the target so that all ions are implanted with essentially the same energy.
Figure 2C:
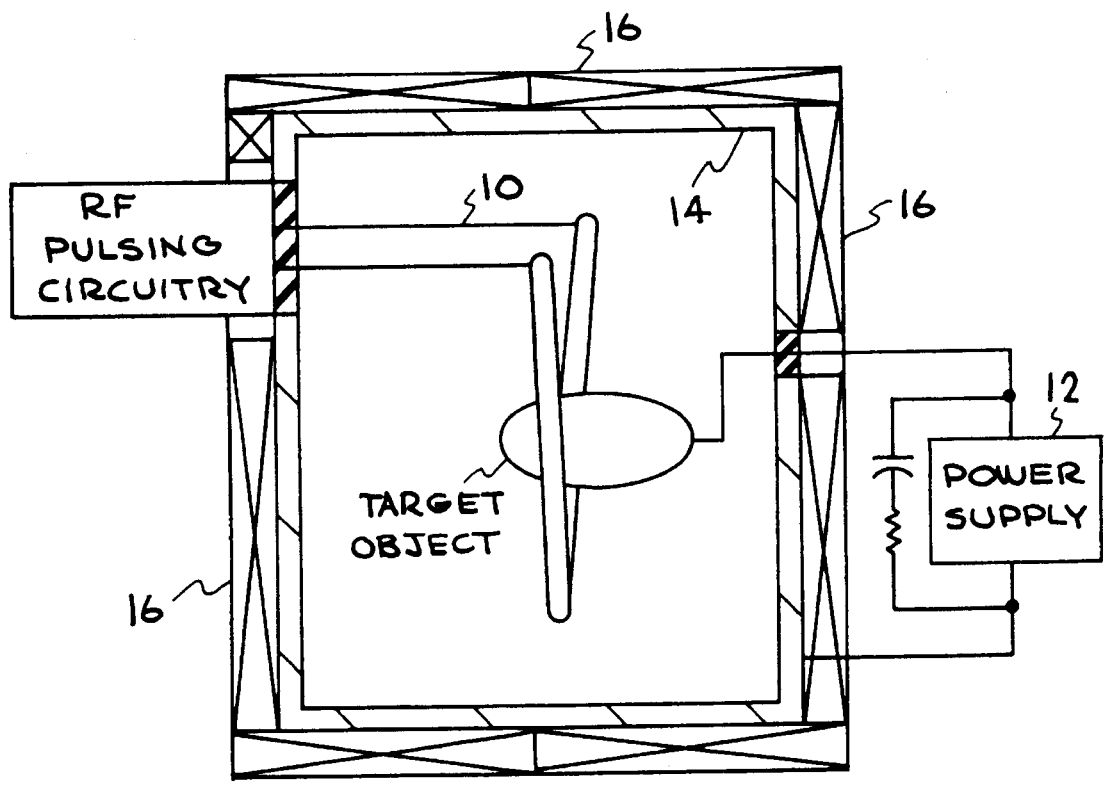
FIG. 2C: is a schematic representation of the inventive plasma ion implantation system showing an RF plasma source antenna and target with constant bias voltage applied simply.

The voltage applied to the target or object to be implanted is called the 'target voltage'. The voltage source that applies the potential to the target is called the 'target voltage source'. The inventive ion implantation method and apparatus, shown in FIG. 2, uses a pulsed plasma source 10 and a constant bias voltage ($V_{target}$), applied to the target 11 by a power supply 12. The target voltage source can be an inexpensive low current power supply. For example, a 20 kV power supply was used. When large targets that draw high currents are used, a high capacitance circuit is connected in parallel to the target power supply. The capacitance required can be calculated from the volume of the target. The time constant of the parallel circuit $t_{RC}$ should be greater than the pulse width of the pulse generator. Pulsing the ion source controls the plasma density, minimizes secondary electron emission, minimizes the likelihood of voltage breakdown by maximizing the gap between the target and the plasma boundary and by maintaining a low density plasma, and eliminates the need for a high power electronic switch between the target and the power supply that applies voltage to the target. The vacuum chamber walls 14 are surrounded by permanent magnets 16 in a cusp configuration that confine the plasma and provide a uniform density plasma. The plasma formation is highly efficient because the electrons and plasma are magnetically confined by the multiamp cusp fields (*Production Of $N^+$ Ions From A Multicusp Ion Beam Apparatus* by K. N. Leung, W. Kunkel, and S. Walther U.S. Pat. No. 5,198,677). The target object, which can be large or small, is placed inside the chamber and is biased with a dc voltage, $V_{target}$. The $V_{target}$ amplitude is varied according to the specific application.

Figure 3:
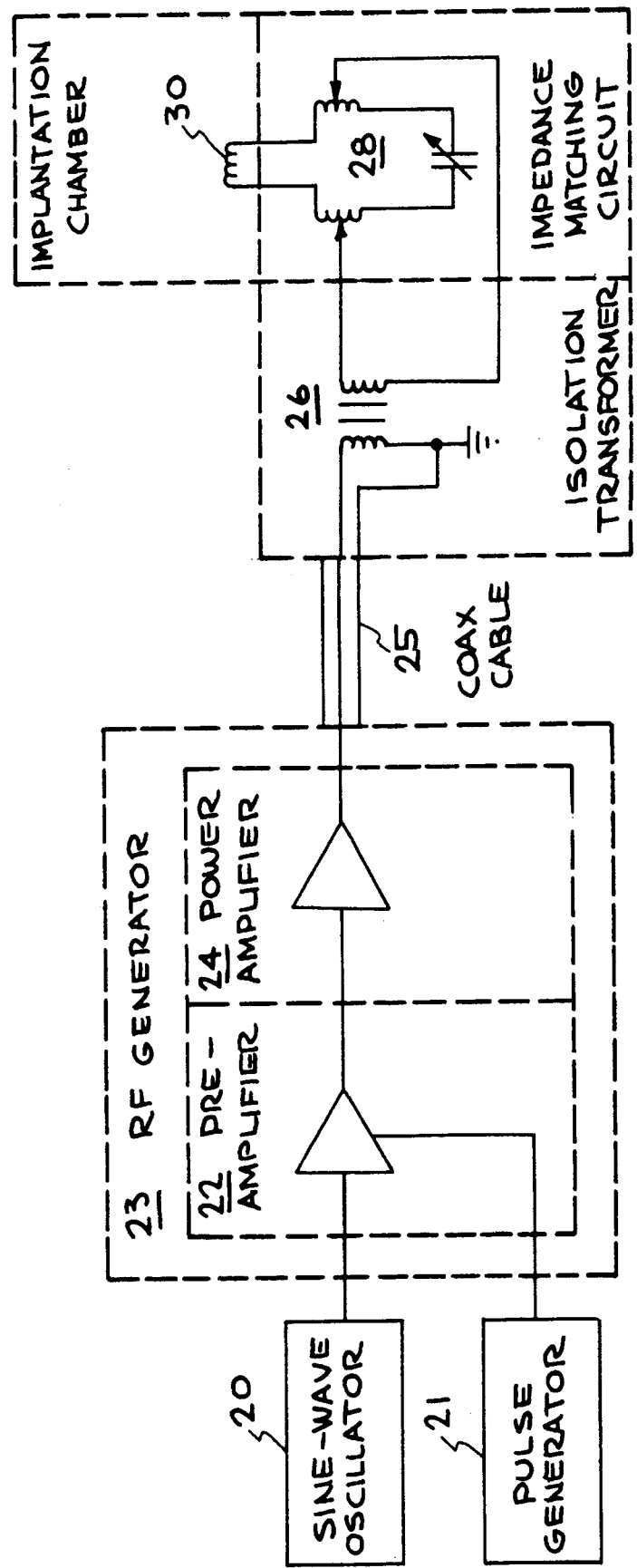
FIG. 3: is a schematic diagram of the RF switching and power system.
Figure 4A:
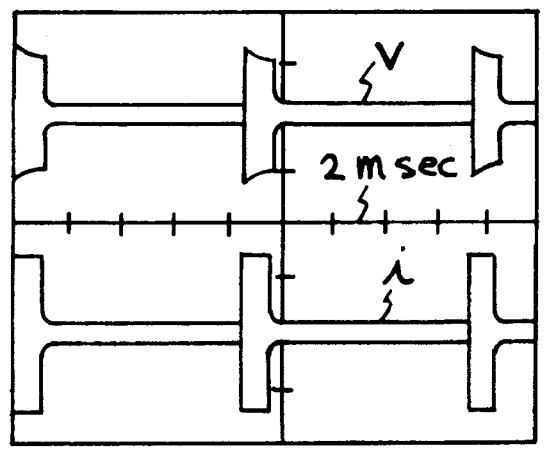
FIG. 4A: illustrates the pulse frequency (111 RF pulses per second) and repetition rate of the RF output voltage and current from the RF generator.
Figure 4B:
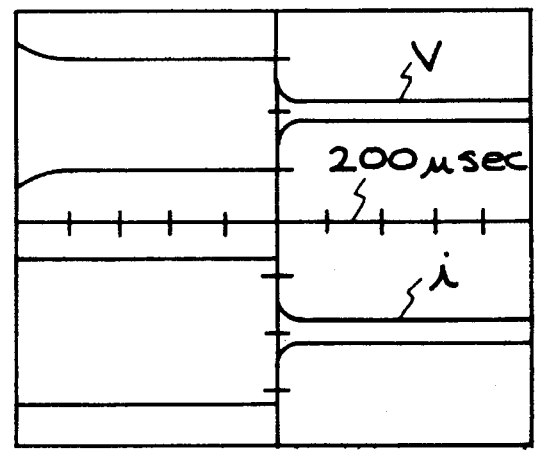
FIG. 4B: illustrates the length of one RF pulse (1 millisecond) at the output of the RF generator and shows one of the envelopes in 4A on an expanded time scale along the abscissa.
Figure 4C:
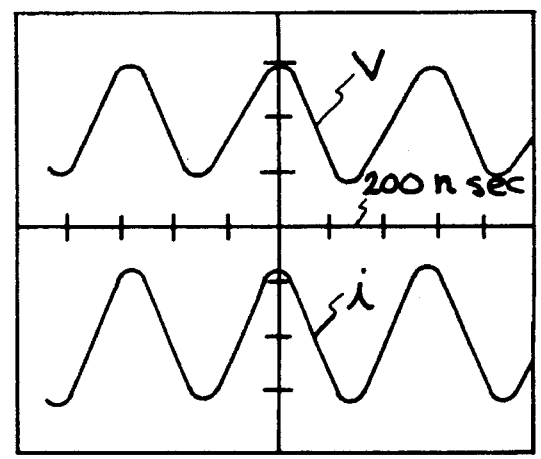
FIG. 4C: shows, by expanding the time scale further, that there is no phase change between the RF voltage and the RF current.

The electrical circuit that pulses the plasma source on and off is called the 'plasma source pulsing circuitry'. An RF pulsing circuit was comprised of a signal generator and amplifier to vary pulse amplitude, width, duty cycle, and other parameters. This is a particularly efficient way to regulate and pulse plasma generation via RF induction discharge using an antenna coil. One type of RF pulsing circuit is shown schematically in FIG. 3. A sine-wave oscillator 20 drives a gated solid state pre-amplifier 22 at a nominal operating frequency of about 2 MHz. The pulse generator 21 allows the pulse width and repetition rate to be adjusted independently. The resulting RF pulses drive a Class C tube amplifier 24. The pre-amplifier 22 and power amplifier 24 comprise the major components of an RF generator 23. One source of an RF generator used for the inventive apparatus is Ion Sorcery Inc., located in Seattle, Wash. The sine-wave oscillator and pulse generator can be purchased as internal components of the RF generator. For an experimental setup, however, an external sine-wave oscillator and pulse generator were used. The output of the RF generator is shown in FIG. 4. The RF generator 23 is tuned by adjusting the frequency of the sine-wave oscillator until the RF voltage and RF current is in phase as shown in FIG. 4C. The flat pulse envelopes shown in FIG. 4B result in a uniform plasma density in the plasma volume. It is important that the current and voltage of the RF generator 23 are in phase to prevent power loss to the antenna. The power from the RF generator 23 is connected by a coaxial cable 25 to an isolation transformer 26. RF generators up to 50 kWatts were used. In order to couple the RF power efficiently into the source plasma via an RF antenna 30, a matching circuit 28 is employed. The matching circuit may be, for example, a commercially available tunable resonant parallel LC circuit. This circuitry is generally available in the literature and is described in more detail in Leung, K. N., et al., *Rev. Sci. Instrum.*, 62(1), January 91, pp. 100–104, incorporated herein by reference. There are, of course, many different electrical circuits that will switch or pulse the electromagnetic signal on and off. These circuits are widely known to those of ordinary skill in the art.

The RF antenna is typically fabricated from copper tubing and is then covered with a layer of insulating material. The insulating material can be glass (U.S. Pat. No. 4,725,449, Ehlers & Leung), porcelain (U.S. application Serial No. 08/010,108), or other insulating material.

For some applications the antenna does not need to be coated with an insulating material. To create a copper plasma, for example, all or a portion of the copper antenna can be left uncoated. This is described in greater detail below.

The plasma can be pulsed by coupling energy to the plasma through other means than RF coupled energy. For example a thermionic cathode can be used. In this case an electronic switch is needed to pulse the filament. Applying an electronic switch to the filament is much easier than applying an electronic switch to the target as Conrad teaches. This is because the electronic switch applied to the filament switches approximately 100 Volts or less while a switch that turns the voltage on and off the target must switch voltages on the order of 20 kV or more. The types of electronic switch needed to pulse a thermionic cathode are generally available and known to those skilled in the art.

Additional plasma sources that can be used to generate plasmas in the inventive plasma immersion implantation device are laser-driven photo-cathode, spark gap, Tungsten filament cathode, or hollow ion cathode. This list is not exhaustive. Any other plasma source capable of being pulsed will work. On particular advantage of the RF source is that it is particularly easy to pulse it with a range of pulse frequencies and pulse lengths.

Both the length and the repetition rate of the pulse are adjustable as needed. For example, the pulse length was varied from about 200 μsec to several msec. The repetition rate has been varied from 1 Hz to 110 Hz. FIG. 4 illustrates 1.8 MHz RF pulses at different pulse widths and repetition rates. Since the pulse length and repetition rate are easily varied, both the implant ion dose rate and the target temperature are controllable. A user of ordinary skill can determine the appropriate pulse length and repetition rate by using a number of diagnostics such as those described in the *Handbook of Ion Implantation Technology*, edited by J. F. Ziegler, Elsevier Science Publishers B. V. (North-Holland, 1992), pp. 223–270, including SIMS analysis, Rutherford backscattering, and trial and error.

Immersing a target in the plasma chamber for ion implantation has the advantage of implanting ions from all sides of a target simultaneously without great limitations from target configuration. The ion implant energy is a direct function of the voltage applied to the target. This voltage is typically applied using an ordinary power source. However the ion implantation energy is limited to the voltage that can be applied to the target without causing electrical breakdown. Pulsing the plasma source and the bias voltage on the target allows the ion implantation energy to equal or exceed the breakdown voltage as is explained below.

Figure 5A:
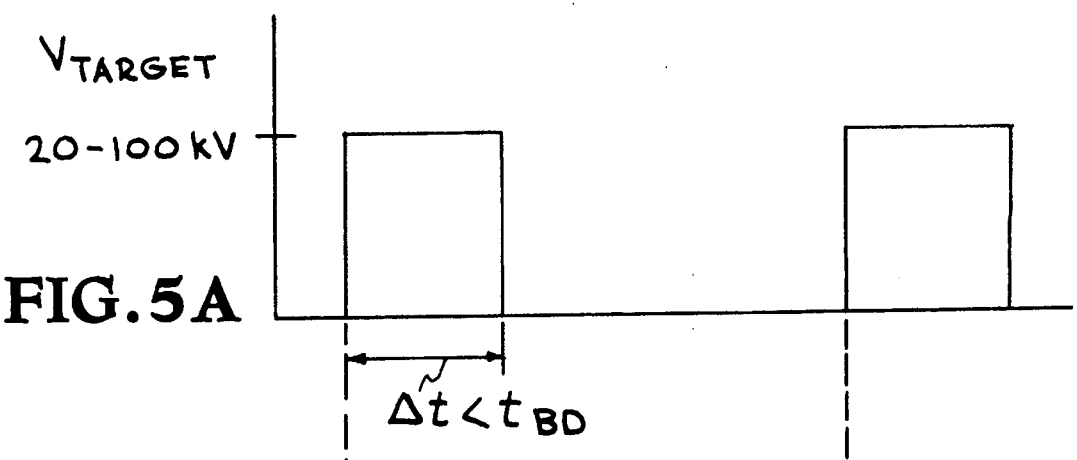
FIG. 5: is a diagram illustrating the relative pulse widths and synchronization of source and target pulses.
Figure 5B:
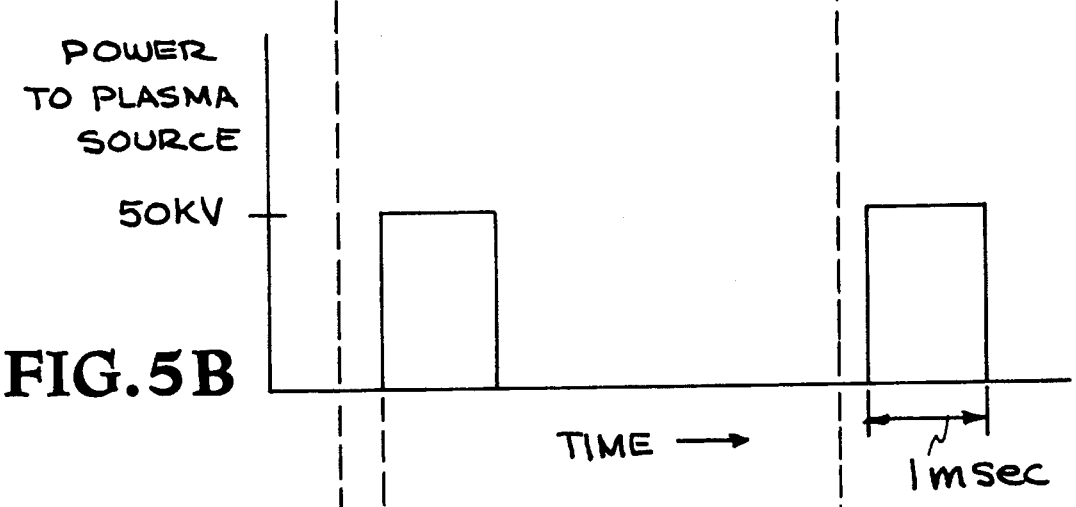
Figure 5C:
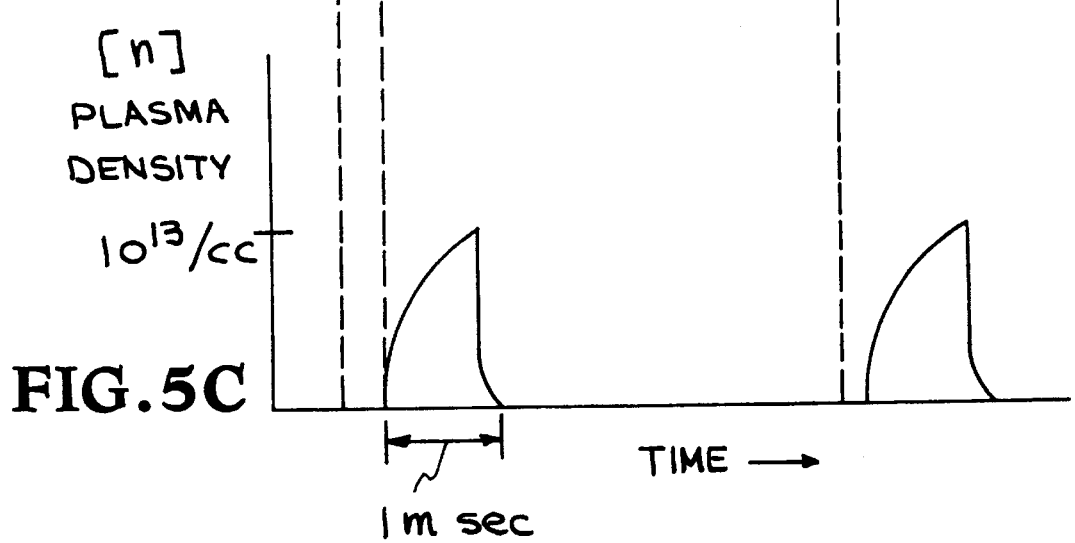

If the bias voltage on the target object is high, for example yielding a voltage gradient of about 50 kV/cm or more, then voltage breakdown can occur easily between the target object and the chamber in the presence of a plasma. Once breakdown voltage is attained, it takes a finite amount of time ($t_{bd}$) for breakdown to occur. This aspect of the breakdown process is used in achieving voltages higher than $V_{bd}$ for ion implantation. The pulse width of the voltage applied to the target is constrained to be less than $t_{bd}$ and the plasma source pulse is initiated immediately after the $V_{target}$ pulse is initiated. Having $V_{target}$ on before the plasma comes on ensures constant implantation energy. Constraining $V_{target}$ pulse to be shorter than $t_{bd}$ prevents breakdown from occurring. The fact that the source is pulsed and therefore turns off between $V_{target}$ pulses prevents plasma buildup and the problems associated with resulting secondary electrons. The pulsed source also allows the dose to be regulated by RF power rather than by the duty cycle of $V_{target}$. The relative timing of the pulses to $V_{target}$, and the pulse generator, along with the associated plasma density resulting from the pulses, is illustrated in FIG. 5.

A further advantage associated with the RF driven plasma system is cleanliness. It produces no cathode material such as tungsten. Thus the level of impurity ions implanted into the target object is reduced over use of a dc tungsten filament.

An RF driven multicusp source (Leung, K. N., et al., Rev. Sci. Instrum., 62(1), January 91, pp. 100–104,) has been operated in both continuous and pulsed mode to generate H⁻ and many types of positive ion beams. Using a porcelain-coated antenna, the lifetime of the source was enhanced and a clean plasma was maintained for a long period of operation. For inert gas plasmas such as He, Ne, Ar, Kr and Xe, the plasma density was as high as $10^{13}$ ions/cc. When diatomic gases, for example $H_2$, $N_2$, and $O_2$ were used, the extracted beam contained almost pure atomic ions.

By introducing diborine ($B_2H_6$) gas into the discharge plasma, boron ions can be created and implanted into targets such as graphite. Boron-doped graphite tiles are useful as a wall material for fusion reactors. Titanium could also be used as a dopant using the inventive pulsed source plasma immersion ion implantation apparatus. To boron-dope graphite walls a multicusp plasma generator (75 cm diameter by 75 cm long) is constructed to implant large objects. This multicusp generator is a scaled-up version of the ion sources that are now employed in the neutral beam injectors of Tokamak at Princeton (TFTR) and the Tokamak at San Diego (Doublet III). (RF Driven multicusp H⁻ Ion Source, by Leung et al., *Rev. Sci. Instrum.* 62 (1), January 1991. The plasma chamber is surrounded with permanent magnets to provide confinement for the primary electrons and the plasma. As a result, large volumes of uniform and quiescent plasmas are formed. Instead of using dc filament discharge, the plasma is generated by RF induction discharges. A porcelain-coated RF antenna generates clean plasma. Since the RF plasma is operated in a pulsed mode, the repetition rate and the pulse length are adjusted to achieve the proper ion dosage without overheating the target. Because the target voltage is constant while the plasma is on, the ion implant energy is well defined and the depth of implant is controllable. A small, negatively biased tungsten filament may be used to aid in starting the plasma. For boron implantation, diborine gas mixed with hydrogen or helium is employed.

Figure 6A:
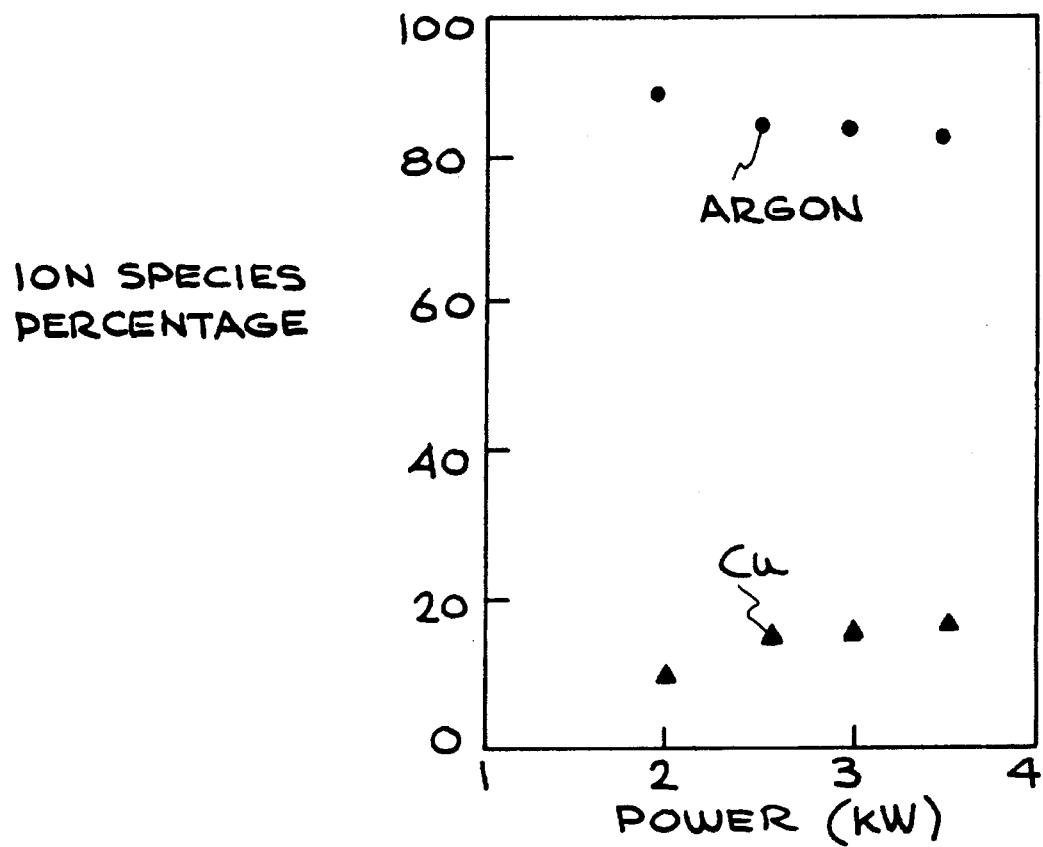
FIG. 6A: shows the copper ion species as a function of RF power when the RF antenna is made from copper and is not coated with another substance.
Figure 6B:
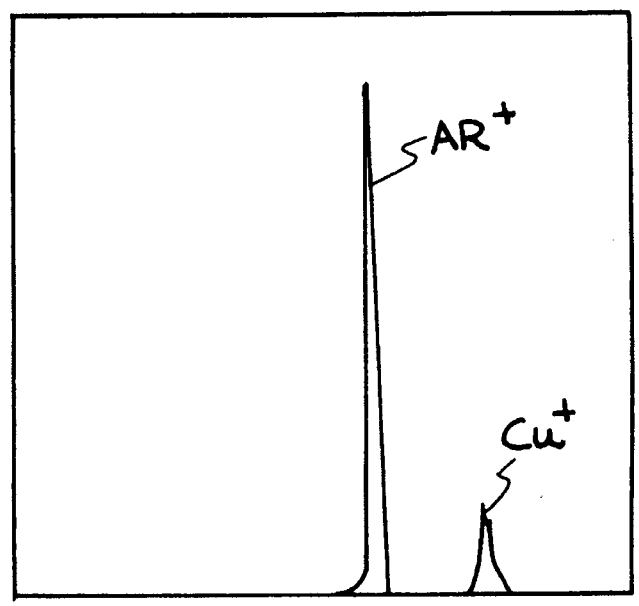
FIG. 6B: is a spectrometer output signal showing the presence of copper ions in the beam.

The same RF source was used to produce steady state metallic ion plasmas, for example copper. The geometry of the plasma source was modified for this application by eliminating a coating over the entire surface of the antenna. In some cases the antenna was used with no coating at all. It is also possible to coat some but not all of the antenna so that some parts of it are protected by an insulating layer. A high negative voltage applied to a copper antenna enabled the background positive ions (for example argon) to sputter the copper off from the antenna surface. The antenna was pulsed in order to prevent electrical breakdown between closely spaced parts of the antenna. Two MHz was used but many other frequencies will also work (Leung, K. N. et al. Nuclear Instruments and Methods in Physics Research, B74 (1993) 291–294,) incorporated herein by reference. Neutral copper atoms were first sputtered from the antenna by the background $Ar^+$ ions. The $Cu^0$ atoms were subsequently ionized by plasma electrons. The mass spectrum in FIG. 6B shows that if a beam was extracted for analysis, it contained about 20% of $Cu^+$ ions and 80% was argon. Other metallic ions (as well as mixed metallic ion compositions) can be generated in a similar manner, that is by coating the uninsulated portion of the antenna with the metal or metal mixture desired. Thus the antenna served both to inductively couple radio-frequency ionizing energy into the plasma source volume, and as a source of metallic vapor.

Other metallic plasmas were generated by replacing the antenna surface material. A simple way of achieving this was to wrap a foil around the antenna coil. If different metallic ions are needed simultaneously, the antenna surface can be fabricated to contain the proper proportion of the compound required. Thus the RF antenna can be used in applications requiring metallic ions. Further metal plasma formed as described above can be mixed with plasma formed from gas introduced to the plasma volume.

The description of illustrative embodiments is not intended to limit the scope of the invention. Various modifications, alternative constructions and equivalents may be employed without departing from the true spirit and scope of the appended claims.

The circuit that pulses the plasma source on and off is called the plasma source electrical pulsing circuitry. (13)

The voltage applied to the target or object to be implanted is called the target voltage. (11)

The voltage source that applies the potential to the target is called the target voltage source.

I claim:

1. A plasma immersion ion implantation apparatus comprising:
   a) a vacuum chamber;
   b) a plasma source located within said vacuum chamber;
   c) means to connect electrical pulsing circuitry to the plasma source, said circuitry comprising,
      i) a sine-wave oscillator;
      ii) a pulse generator;
      iii) an RF generator, with one input connected to the output of the sine-wave oscillator and the other input electrically connected to the output of the pulse generator;
      iv) an isolation transformer;
      v) a coaxial cable electrically connecting the output of the RF generator to the isolation transformer;
      vi) an impedance matching circuit with input electrically connected to the isolation transformer and output electrically connected to the plasma source; and
   d) means to connect a voltage source to the target.

2. The apparatus of claim 1 wherein the vacuum chamber has electrically conducting walls.

3. The apparatus of claim 1 further comprising an armature or stand to hold target for implantation.

4. The apparatus of claim 1 wherein the implantation apparatus includes a supply means for supplying an ionizable gas into the vacuum chamber.

5. The apparatus of claim 4 wherein the gas is selected from the group consisting of nitrogen, hydrogen, oxygen, neon, argon, diborine, arsine, phosphine, xenon, helium, methane, and carbon dioxide.

6. The apparatus of claim 1 wherein the plasma source is a radio frequency antenna.

7. The apparatus of claim 1 wherein the RF generator comprises:
   a) a preamplifier connected to the outputs of the sine-wave oscillator and the pulse generator; and
   b) a power amplifier connected to the output of the preamplifier.

8. The apparatus of claim 1 wherein the sine-wave oscillator and the pulse generator are internal components of the RF generator.

9. The apparatus of claim 1 wherein the plasma source pulsing circuitry comprises an electronic switch.

10. The apparatus of claim 9 wherein the electronic switch turns a voltage of 100 V or less on and off.

11. The apparatus of claim 1 wherein the target voltage source applies an electrical potential to the target relative to the vacuum chamber walls.

12. The apparatus of claim 1 wherein the target voltage source comprises a power supply between 15 kilovolts and 150 kV.

13. The apparatus of claim 12 wherein the target voltage source comprises a power supply between 20 kilovolts and 100 kV.

14. The apparatus of claim 13 wherein the target voltage source comprises a 20 kilovolt power supply.

15. The apparatus of claim 12 wherein a capacitive circuit is connected in parallel to the target voltage source.

16. The apparatus of claim 15 wherein the capacitive circuit comprises an RC circuit.

17. The apparatus of claim 15 wherein the circuit's capacitance is determined by the charge that the target can hold.

18. The apparatus of claim 1 further comprising means for confining the plasma in the vacuum chamber.

19. The apparatus of claim 18 wherein the confinement means comprises a plurality of magnets spaced about the periphery of the vacuum chamber.

20. The apparatus of claim 19 wherein the magnets are permanent magnets.

21. The apparatus of claim 20 wherein the magnets are in a cusp configuration.

22. The apparatus of claim 1 further comprising means to connect an electronic switch between the target and the target voltage supply to pulse a target voltage on and off.

23. The apparatus of claim 20 wherein an electronic switch is connected in series with the target and the target voltage supply.

24. The apparatus of claim 23 wherein the plasma source pulsing circuit turns the plasma source on immediately before the electronic switch turns the target voltage supply on.

25. The apparatus of claim 23 wherein the target voltage source is switched on for a time that is shorter than the time required for a voltage between the plasma discharge and the target to break down.

* * * * *